United States Patent
Kim et al.

(10) Patent No.: US 10,796,891 B2
(45) Date of Patent: Oct. 6, 2020

(54) SUBSTRATE PROCESSING APPARATUS AND SUBSTRATE PROCESSING METHOD

(71) Applicant: SEMES CO., LTD., Chungcheongnam-do (KR)

(72) Inventors: Seon Do Kim, Bucheon-si (KR); Hyung Joon Kim, Pyeongtaek-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/161,180

(22) Filed: Oct. 16, 2018

(65) Prior Publication Data

US 2019/0115195 A1 Apr. 18, 2019

(30) Foreign Application Priority Data

Oct. 17, 2017 (KR) .................. 10-2017-0134553

(51) Int. Cl.
*H01J 37/32* (2006.01)

(52) U.S. Cl.
CPC .... *H01J 37/32935* (2013.01); *H01J 37/3244* (2013.01); *H01J 37/32715* (2013.01); *H01J 2237/24564* (2013.01)

(58) Field of Classification Search
CPC .......... H01J 37/32715; H01J 37/32935; H01J 37/3244; H01J 2237/24564
See application file for complete search history.

(56) References Cited

U.S. PATENT DOCUMENTS

| | | | | | |
|---|---|---|---|---|---|
| 5,990,477 | A | * | 11/1999 | Tomita | G11B 9/1454 250/306 |
| 2004/0069408 | A1 | * | 4/2004 | Cheng | H01J 37/32458 156/345.25 |
| 2010/0007362 | A1 | * | 1/2010 | Booth | H01J 37/32935 324/686 |

FOREIGN PATENT DOCUMENTS

| | | |
|---|---|---|
| CN | 102084472 A | 6/2011 |
| CN | 102339714 A | 2/2012 |
| CN | 102560438 A | 7/2012 |
| CN | 104995840 A | 10/2015 |
| CN | 107119265 A | 9/2017 |
| JP | H02151986 A | 6/1990 |
| JP | H06252018 A | 9/1994 |
| JP | 09171992 A * | 6/1997 |
| JP | 2007129020 A | 5/2007 |
| KR | 1020000014576 A | 3/2000 |
| KR | 10-2004-0053452 A | 6/2004 |
| KR | 10-2006-0122417 A | 11/2006 |
| KR | 1020100069392 A | 6/2010 |
| KR | 1020140108168 A | 9/2014 |
| KR | 10-2015-0106974 A | 9/2015 |

(Continued)

*Primary Examiner* — Yuechuan Yu
(74) *Attorney, Agent, or Firm* — Li & Cai Intellectual Property (USA) Office

(57) ABSTRACT

Disclosed is a substrate processing apparatus including a chamber having a processing space inside, a support unit that supports a substrate in the processing space, a gas supply unit that supplies gas into the processing space, a plasma source that generates plasma from the gas supplied into the processing space, and a detection unit that is provided in a sidewall of the chamber and that measures an impedance change to detect a degree of adsorption of particles on an inner wall of the chamber or a surface of a part that is exposed to the processing space.

8 Claims, 5 Drawing Sheets

(56) References Cited

FOREIGN PATENT DOCUMENTS

KR 10-1579506 B1 12/2015

* cited by examiner

SUBSTRATE PROCESSING APPARATUS AND SUBSTRATE PROCESSING METHOD

CROSS-REFERENCE TO RELATED APPLICATIONS

A claim for priority under 35 U.S.C. § 119 is made to Korean Patent Application No. 10-2017-0134553 filed on Oct. 17, 2017, in the Korean Intellectual Property Office, the entire contents of which are hereby incorporated by reference.

BACKGROUND

Embodiments of the inventive concept described herein relate to a substrate processing apparatus and method, and more particularly, relate to a substrate processing apparatus and method for detecting a degree of adsorption of particles on an inner wall of a chamber or a surface of a part.

Various processes, such as photolithography, etching, thin-film deposition, ion implantation, cleaning, and the like, are performed to manufacture semiconductor devices. Among these processes, etching, thin-film deposition, and cleaning processes use a substrate processing apparatus using plasma.

In general, plasma processing of a substrate is performed by supplying a process gas into a chamber and exciting the process gas into plasma. In the substrate plasma processing, part of the plasma is attached to an inner wall of the chamber to act as particles. Due to this, a cleaning process for uniformly maintaining the internal state of the chamber is performed before and after the plasma processing.

In the related art, particles attached to the inner wall of the chamber are observed with naked eyes or detected by taking a photo of the inner wall of the chamber with a camera. Therefore, it is impossible to accurately detect the degree of adsorption of particles on the inner wall of the chamber.

SUMMARY

Embodiments of the inventive concept provide a substrate processing apparatus and method for detecting a degree of adsorption of particles on an inner wall of a chamber or a surface of a part by measuring an impedance change.

Aspects of the inventive concept are not limited to the above-described aspect, and any other aspects not mentioned herein may be clearly understood from this specification and the accompanying drawings by those skilled in the art to which the inventive concept pertains.

According to an aspect of an embodiment, a substrate processing apparatus includes a chamber having a processing space inside, a support unit that supports a substrate in the processing space, a gas supply unit that supplies gas into the processing space, a plasma source that generates plasma from the gas supplied into the processing space, and a detection unit that is provided in a sidewall of the chamber and that measures an impedance change to detect a degree of adsorption of particles on an inner wall of the chamber or a surface of a part that is exposed to the processing space.

The detection unit may include a diaphragm installed in an inspection space in the sidewall of the chamber and deformed by deposition of particles, the inspection space being in communication with the processing space, a voltage source that applies current to the diaphragm, and a controller that measures the impedance change by using the current flowing through the diaphragm and detects the degree of adsorption of particles based on the impedance change.

The detection unit may further include a plate spaced apart from the diaphragm and disposed farther away from the sidewall of the chamber than the diaphragm. One end of the voltage source may be connected to the diaphragm, and an opposite end of the voltage source may be connected to the plate.

Capacitance of the diaphragm may be changed by deposition of the particles, and the controller may measure the capacitance change of the diaphragm and may determine that the degree of adsorption of particles is beyond an allowable range, when the capacitance change of the diaphragm exceeds a preset range.

The detection unit may further include a measuring instrument that measures a frequency of vibration of the plate, and the controller may predict a degree of adsorption of particles based on a change in the frequency of vibration of the plate and may verify accuracy by comparing the predicted degree of adsorption of particles with the degree of adsorption of particles detected based on the impedance change.

The diaphragm may be implemented with a thin plate of 100 μm or less.

The controller may output notification to inform of a replacement cycle of the chamber when it is determined that the degree of adsorption of particles is beyond the allowable range.

According to another aspect of an embodiment, a substrate processing method includes measuring an impedance change and detecting a degree of adsorption of particles on an inner wall of a chamber or a surface of a part that is exposed to a processing space of the chamber, by using a detection unit provided in a sidewall of the chamber.

The detection unit may include a diaphragm installed in an inspection space in the sidewall of the chamber and deformed by deposition of particles, the inspection space being in communication with the processing space, and a voltage source that applies current to the diaphragm. The detecting of the degree of adsorption of particles on the inner wall of the chamber or the surface of the part may include measuring the impedance change by using the current flowing through the diaphragm and detecting the degree of adsorption of particles based on the impedance change.

The detection unit may further include a plate spaced apart from the diaphragm and disposed farther away from the sidewall of the chamber than the diaphragm. One end of the voltage source may be connected to the diaphragm, and an opposite end of the voltage source may be connected to the plate.

Capacitance of the diaphragm may be changed by deposition of the particles. The measuring of the impedance change may include measuring a capacitance change of the diaphragm, and the detecting of the degree of adsorption of particles based on the impedance change may include determining that the degree of adsorption of particles is beyond an allowable range, when the capacitance change of the diaphragm exceeds a preset range.

The detecting of the degree of adsorption of particles on the inner wall of the chamber or the surface of the part may further include measuring a frequency of vibration of the plate, predicting a degree of adsorption of particles based on a change in the frequency of vibration of the plate, and verifying accuracy by comparing the predicted degree of adsorption of particles with the degree of adsorption of particles detected based on the impedance change.

The diaphragm may be implemented with a thin plate of 100 μm or less.

The detecting of the degree of adsorption of particles on the inner wall of the chamber or the surface of the part may further include outputting notification to inform of a replacement cycle of the chamber when it is determined that the degree of adsorption of particles is beyond the allowable range.

According to various embodiments of the inventive concept, a degree of adsorption of particles on an inner wall of a chamber or a surface of a part can be accurately and conveniently measured by using an impedance change.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
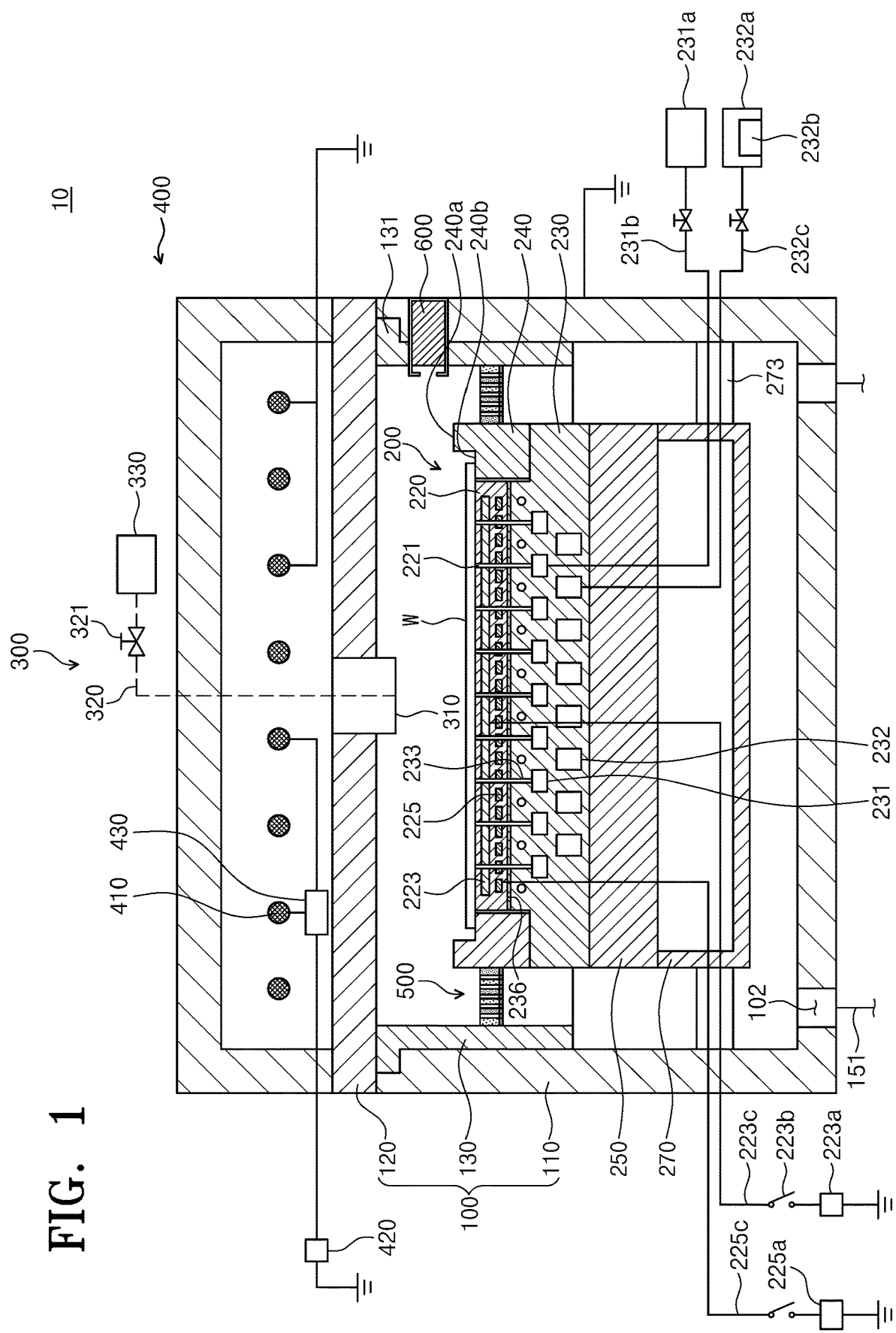
FIG. 1 is a sectional view illustrating a substrate processing apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

FIG. 1 is a sectional view illustrating a substrate processing apparatus 10 according to an embodiment of the inventive concept.

Referring to FIG. 1, the substrate processing apparatus 10 includes a chamber 100, a support unit 200, a gas supply unit 300, a plasma source 400, a baffle unit 500, and a detection unit 600.

The chamber 100 has a space in which substrate processing is performed. The chamber 100 includes a housing 110, a sealing cover 120, and a liner 130.

The housing 110 has a space therein, which is open at the top. The inner space of the housing 110 serves as a processing space in which substrate processing is performed. The housing 110 is formed of metal. The housing 110 may be formed of aluminum. The housing 110 may be grounded. The housing 110 has exhaust holes 102 formed in the bottom thereof. Exhaust lines 151 are connected to the exhaust holes 102. Reaction byproducts generated during processing and gases staying in the inner space of the housing 110 may be discharged to the outside via the exhaust lines 151. The pressure inside the housing 110 is reduced to a predetermined pressure by the exhaust process.

The sealing cover 120 covers the open top of the housing 110. The sealing cover 120 has a plate shape and seals the inner space of the housing 110. The sealing cover 120 may include a dielectric substance window.

The liner 130 is provided inside the housing 110. The liner 130 is formed in a space that is open at the top and the bottom. The liner 130 may have a cylindrical shape. The liner 130 may have a radius corresponding to the inner surface of the housing 110. The liner 130 is provided along the inner surface of the housing 110. A support ring 131 is formed on the upper end of the liner 130. The support ring 131 has an annular plate shape and protrudes outside the liner 130 along the periphery of the liner 130. The support ring 131 is placed on the upper end of the housing 110 and supports the liner 130. The liner 130 may be formed of the same material as that of the housing 110. That is, the liner 130 may be formed of aluminum. The liner 130 protects the inner surface of the housing 110. Arc discharge may occur inside the chamber 100 in a process in which a process gas is excited. The arc discharge causes damage to surrounding apparatuses. The liner 130 protects the inner surface of the housing 110, thereby preventing the inner surface of the housing 110 from being damaged by the arc discharge. Furthermore, the liner 130 prevents impurities generated during substrate processing from being deposited on the inner wall of the housing 110. The liner 130 is inexpensive and is easy to replace, compared with the housing 110. Therefore, in the case where the liner 130 is damaged by arc discharge, an operator may replace the liner 130 with a new one.

The support unit 200 is located inside the housing 110. The support unit 200 supports a substrate W. The support unit 200 may include an electrostatic chuck 210 that electrostatically clamps the substrate W. Alternatively, the support unit 200 may support the substrate W by various methods such as mechanical clamping. Hereinafter, the support unit 200 including the electrostatic chuck 210 will be described.

The support unit 200 includes the electrostatic chuck 210, an insulating plate 250, and a lower cover 270. The support unit 200 may be located in the chamber 100 and may be spaced apart upward from the bottom of the housing 110.

The electrostatic chuck 210 includes a dielectric plate 220, an electrode 223, a heater 225, a support plate 230, and a focus ring 240.

The dielectric plate 220 is located at the top of the electrostatic chuck 210. The dielectric plate 220 is formed of a disk-shaped dielectric substance. The substrate W is placed on the top side of the dielectric plate 220. The top side of the dielectric plate 220 has a smaller radius than the substrate W. Due to this, the edge region of the substrate W is located outside the dielectric plate 220. The dielectric plate 220 has first supply passages 221 formed therein. The first supply passages 221 extend from the top side to the bottom side of the dielectric plate 210. The first supply passages 221 are spaced apart from each other and serve as passages through which a heat transfer medium is supplied to the bottom side of the substrate W.

The electrode 223 and the heater 225 are buried in the dielectric plate 220. The electrode 223 is located above the heater 225. The electrode 223 is electrically connected to a first lower power supply 223a. The first lower power supply 223a includes a DC power supply. A switch 223b is installed between the electrode 223 and the first lower power supply 223a. The electrode 223 may be electrically connected to, or disconnected from, the first lower power supply 223a depending on on/off states of the switch 223b. When the switch 223b is in the on position, DC current is applied to the electrode 223. The current applied to the electrode 223 induces electrostatic force between the electrode 223 and the substrate W, and the substrate W is clamped to the dielectric plate 220 by the electrostatic force.

The heater 225 is electrically connected to a second lower power supply 225a. The heater 225 resists current applied by the second lower power supply 225a to generate heat. The generated heat is transferred to the substrate W via the dielectric plate 220. The substrate W is maintained at a predetermined temperature by the heat generated from the heater 225. The heater 225 includes a spiral coil.

The support plate 230 is located below the dielectric plate 220. The bottom side of the dielectric plate 220 and the top side of the support plate 230 may be bonded by an adhesive 236. The support plate 230 may be formed of aluminum. The top side of the support plate 230 may have a step such that the central region is located in a higher position than the edge region. The central region of the top side of the support plate 230 has an area corresponding to the bottom side of the dielectric plate 220 and is bonded to the bottom side of the dielectric plate 220. The support plate 230 has a first circulation passage 231, a second circulation passage 232, and second supply passages 233 formed therein.

The first circulation passage 231 serves as a passage through which a heat transfer medium circulates. The first circulation passage 231 may be formed in a spiral shape in the support plate 230. Alternatively, the first circulation passage 231 may have a plurality of concentric annular passages with different radii. The concentric annular passages may be in communication with each other. The first circulation passage 231 is formed at the same height.

The second circulation passage 232 serves as a passage through which a cooling fluid circulates. The second circulation passage 232 may be formed in a spiral shape in the support plate 230. Alternatively, the second circulation passage 232 may have a plurality of concentric annular passages with different radii. The concentric annular passages may be in communication with each other. The second circulation passage 232 may have a larger cross-sectional area than the first circulation passage 231. The second circulation passage 232 is formed at the same height. The second circulation passage 232 may be located below the first circulation passage 231.

The second supply passages 233 extend upward from the first circulation passage 231 to the top side of the support plate 230. As many second supply passages 233 as the first supply passages 221 are formed. The second supply passages 233 connect the first circulation passage 231 and the first supply passages 221.

The first circulation passage 231 is connected to heat transfer medium storage 231a via a heat transfer medium supply line 231b. A heat transfer medium is stored in the heat transfer medium storage 231a. The heat transfer medium includes an inert gas. According to an embodiment, the heat transfer medium includes helium (He) gas. The helium gas is supplied to the first circulation passage 231 via the heat transfer medium supply line 231b and then supplied to the bottom side of the substrate W through the second supply passages 233 and the first supply passages 221 in a serial order. The helium gas serves as a medium through which heat transferred from plasma to the substrate W is transferred to the electrostatic chuck 210.

The second circulation passage 232 is connected to cooling fluid storage 232a via a cooling fluid supply line 232c. A cooling fluid is stored in the cooling fluid storage 232a. A cooler 232b may be provided inside the cooling fluid storage 232a. The cooler 232b cools the cooling fluid to a predetermined temperature. Alternatively, the cooler 232b may be installed on the cooling fluid supply line 232c. The cooling fluid supplied to the second circulation passage 232 via the cooling fluid supply line 232c cools the support plate 230 while circulating along the second circulation passage 232. The support plate 230, while being cooled, cools the dielectric plate 220 and the substrate W together to maintain the substrate W at a predetermined temperature.

The focus ring 240 is disposed in the edge region of the electrostatic chuck 210. The focus ring 240 has an annular shape and is disposed around the dielectric plate 220. The top side of the focus ring 240 may have a step such that an outer portion 240a is located in a higher position than an inner portion 240b. The inner portion 240b of the top side of the focus ring 240 is flush with the top side of the dielectric plate 220. The inner portion 240b of the top side of the focus ring 240 supports the edge region of the substrate W that is located outside the dielectric plate 220. The outer portion 240a of the top side of the focus ring 240 is located to surround the edge of the substrate W. The focus ring 240 allows plasma in the chamber 100 to be concentrated on the region that faces the substrate W.

The insulating plate 250 is located below the support plate 230. The insulating plate 250 has a cross-sectional area corresponding to the support plate 230. The insulating plate 250 is located between the support plate 230 and the lower cover 270. The insulating plate 250 is formed of an insulating material and electrically insulates the support plate 230 from the lower cover 270.

The lower cover 270 is located at the bottom of the support unit 200. The lower cover 270 is spaced apart upward from the bottom of the housing 110. The lower cover 270 has a space formed therein, which is open at the top. The top side of the lower cover 270 is covered with the insulating plate 250. Therefore, the outer diameter of the cross-section of the lower cover 270 may be equal to the diameter of the insulating plate 250. A lift pin module (not illustrated) that moves the transferred substrate W from an external transfer member to the electrostatic chuck 210 may be located in the inner space of the lower cover 270.

The lower cover 270 has connecting members 273. The connecting members 273 connect the outer surface of the lower cover 270 and the inner wall of the housing 110. The connecting members 273 may be provided on the outer surface of the lower cover 270 at predetermined intervals. The connecting members 273 support the support unit 200 inside the chamber 100. Furthermore, the connecting members 273 are connected to the inner wall of the housing 110 to allow the lower cover 270 to be electrically grounded. A first power line 223c connected to the first lower power supply 223a, a second power line 225c connected to the second lower power supply 225a, the heat transfer medium supply line 231b connected to the heat transfer medium storage 231a, and the cooling fluid supply line 232c connected to the cooling fluid storage 232a extend toward the inside of the lower cover 270 via the inner spaces of the connecting members 273.

The gas supply unit 300 supplies a process gas into the chamber 100. The gas supply unit 300 includes a gas supply nozzle 310, a gas supply line 320, and gas storage 330. The gas supply nozzle 310 is installed in the center of the sealing cover 120. The gas supply nozzle 310 has an injection hole formed in the bottom thereof. The injection hole is located below the sealing cover 120 and supplies the process gas into the processing space inside the chamber 100. The gas supply line 320 connects the gas supply nozzle 310 and the gas storage 330. The gas supply line 320 is used to supply the process gas stored in the gas storage 330 to the gas supply nozzle 310. A valve 321 is installed on the gas supply line 320. The valve 321 opens/closes the gas supply line 320 and adjusts the amount of the process gas supplied via the gas supply line 320.

The plasma source 400 excites the process gas inside the chamber 100 into plasma. According to an embodiment of the inventive concept, the plasma source 400 may be implemented with an ICP type plasma source, but is not limited thereto. The plasma source 400 includes an antenna 410, a high-frequency power supply 420 and power distributor 430. The antenna 410 receives a signal from the high-frequency power supply 420 and induces an electromagnetic field, thereby generating plasma. The power distributor 430 distributes a signal from the high-frequency power supply 420 to the antenna 410.

The detection unit 600 may be provided in the sidewall 111 of the chamber 100. The detection unit 600 may be provided in a hole 112 formed in the inner circumferential surface of the housing 110. The detection unit 600 may be provided in a hole 112 formed through the liner 130. According to an embodiment, the detection unit 600 may be provided on a view port formed in the sidewall of the chamber 100. The detection unit 600 measures an impedance change and detects the degree to which particles (e.g., polymers) generated during processing are adsorbed on the inner wall of the chamber 100, or a surface of a part, which is exposed to the processing space of the chamber 100.

Specifically, the detection unit 600 may detect the degree of adsorption of particles on the inner wall of the chamber 100 or the surface of the part by using a diaphragm that is deformed by deposition of particles introduced through a hole formed in the housing 110. A specific configuration of the detection unit 600 will be described below with reference to FIG. 2.

The baffle unit 500 is located between the inner wall of the housing 110 and the support unit 200. The baffle unit 500 includes a baffle having through-holes. The baffle has an annular shape. The process gas supplied into the housing 110 passes through the through-holes of the baffle and is exhausted via the exhaust holes 102. The flow of the process gas may be controlled depending on the shape of the baffle and the shape of the through-holes.

Figure 2:
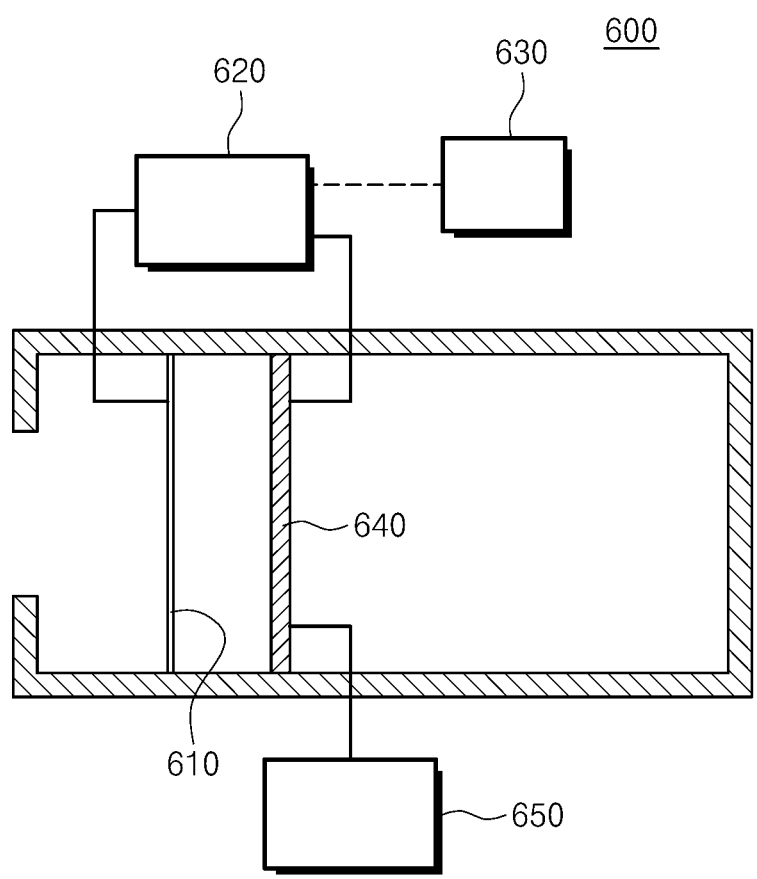
FIG. 2 is a view illustrating a specific configuration of a detection unit according to an embodiment of the inventive concept.

FIG. 2 is a view illustrating a specific configuration of the detection unit 600 according to an embodiment of the inventive concept.

Referring to FIG. 2, the detection unit 600 may include a diaphragm 610, a voltage source 620, a controller 630, a plate 640, and a measuring instrument 650.

Figure 3:
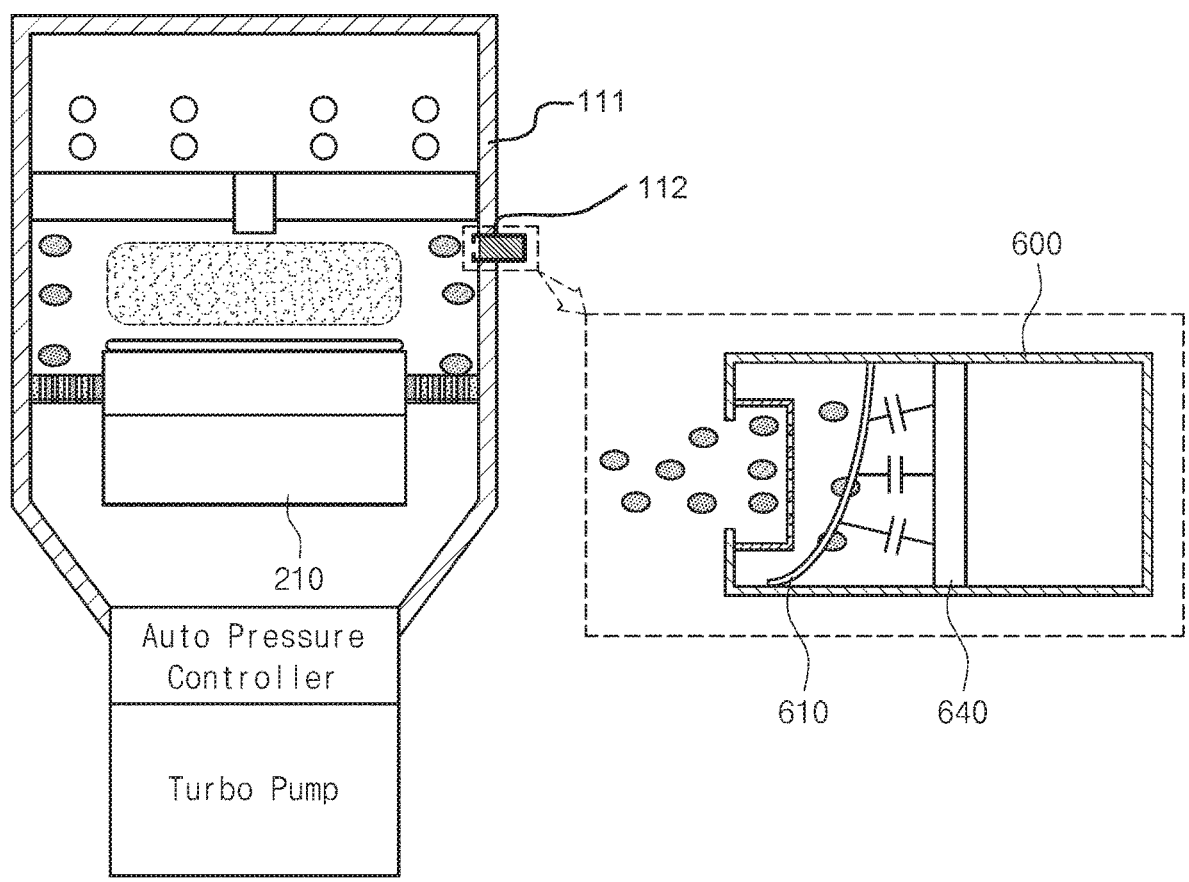
FIGS. 3 and 4 are views for explaining a method of detecting a degree of adsorption of particles according to an embodiment of the inventive concept.

The diaphragm 610, as illustrated in FIG. 3, is installed in an inspection space in the sidewall 111 of the chamber 100 and is deformed by deposition of particles thereon. The inspection space is in communication with the processing space of the chamber 100. According to an embodiment, the diaphragm 610 may be implemented with a thin plate of 100 µm or less. Without being limited thereto, however, the diaphragm 610 may be formed of various materials that are deformable by deposition of particles thereon.

The voltage source 620 is connected to the diaphragm 610 and the plate 640 and applies current to the diaphragm 610 and the plate 640. The controller 630 measures an impedance change by using the current flowing through the diaphragm 610. Based on the impedance change of the diaphragm 610, the controller 630 may detect the degree of adsorption of particles on the inner wall of the chamber 100 or a surface of a part.

Figure 4:
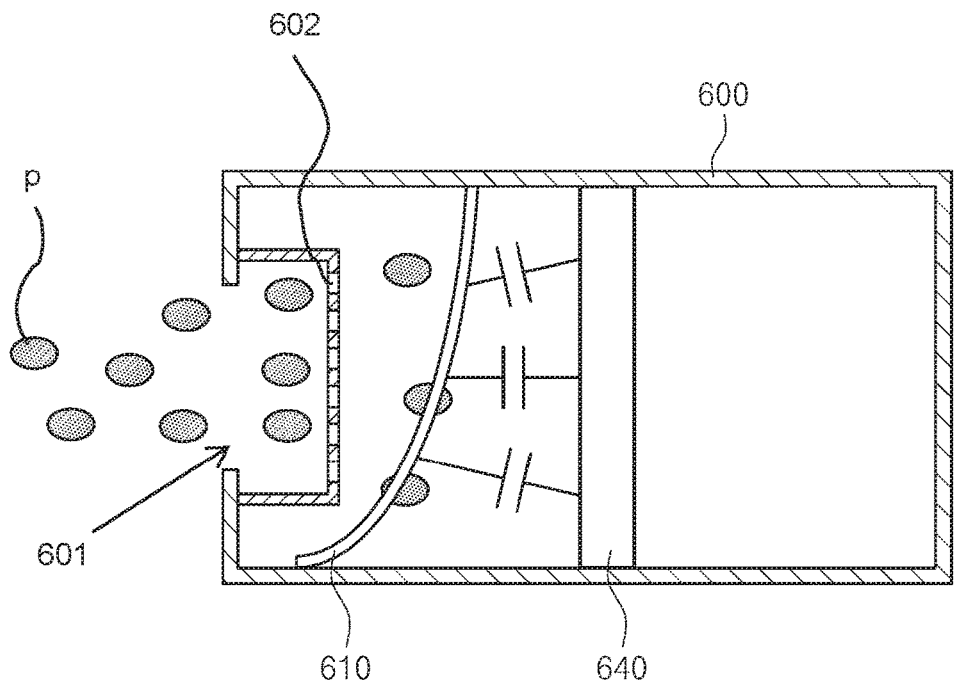

Specifically, referring to FIG. 4, with an increase in the amount of particles p (polymers) adsorbed on the diaphragm 610, through the orifice 601, and through holes 602, the distance between the diaphragm 610 and the plate 640 decreases, and therefore the capacitance value of Capacitance C is given by Equation $C=(E \times S)/d$, where E is the permittivity of a dielectric substance, S is the cross-sectional area of polar plates, and d is the distance between the polar plates. Accordingly, the capacitance C increases with a decrease in the distance d between the diaphragm 610 and the plate 640. When the capacitance value of the diaphragm 610 is greater than a specific value, the controller 630 may determine that the degree of adsorption of particles on the inner wall of the chamber 100 or the surface of the part exceeds an allowable range, using the characteristic that the capacitance value of the diaphragm 610 increases with an increase in the amount of particles adsorbed on the diaphragm 610. When it is determined that the degree of adsorption of particles exceeds the allowable range, the controller 630 may output notification to inform of the replacement cycle of the chamber 100. Accordingly, a user may accurately and conveniently measure the degree of adsorption of particles on the inner wall of the chamber 100 or the surface of the part.

Figure 5:
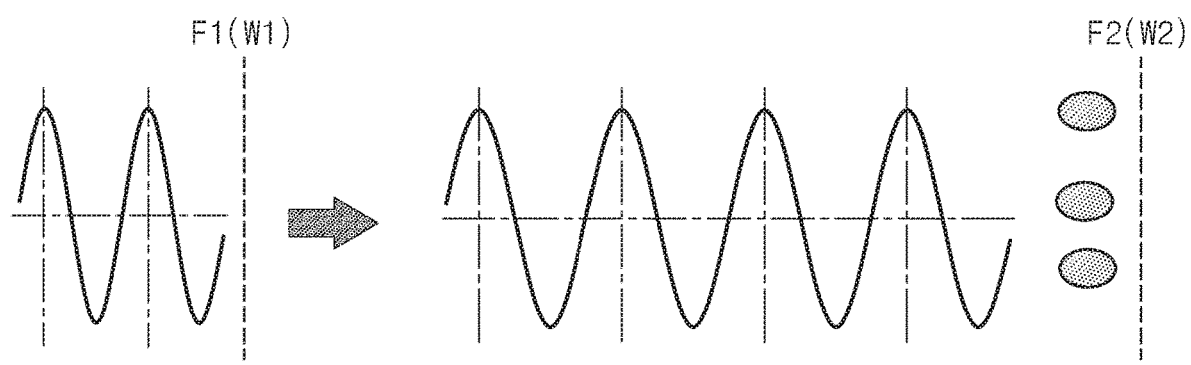
FIG. 5 is a view for explaining a method of verifying the accuracy of the particle adsorption degree detection method according to an embodiment of the inventive concept.

The plate 640 is spaced apart from the diaphragm 610. The plate 640 is located farther away from the sidewall of the chamber 100 than the diaphragm 610. The measuring instrument 650 is connected to the plate 640. The measuring instrument 650 may measure the frequency of vibration of the plate 640. The controller 630 may predict a degree of adsorption of particles, based on a change in the frequency of vibration of the plate 640 and may verify the accuracy by comparing the predicted degree of adsorption of particles with the degree of adsorption of particles detected based on the impedance change of the diaphragm 610. As illustrated in FIG. 5, the period of vibration of the plate 640 may increase according to adsorption of particles. That is, the controller 630 may predict a degree of adsorption of particles by using the period of vibration of the plate 640 that is measured by the measuring instrument 650.

For example, when the difference between the degree of adsorption of particles detected based on the impedance change of the diaphragm 610 and the degree of adsorption of particles predicted based on the change in the frequency of vibration of the plate 640 is greater than a preset value, the controller 630 may determine that the detected degree of adsorption of particles is inaccurate. Accordingly, the controller 630 may verify the degree of adsorption of particles by using the change in the frequency of vibration of the plate 640, and when there is an error in the degree of adsorption of particles measured based on the impedance change of the diaphragm 610, the controller 630 may exclude the measured degree of adsorption of particles, thereby more accurately detecting a degree of adsorption of particles.

Figure 6:
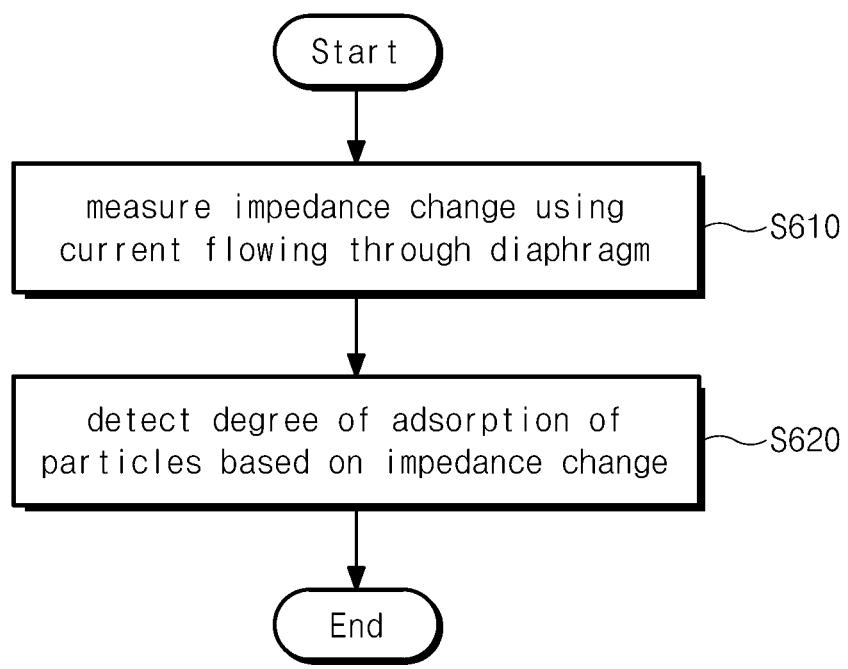
FIG. 6 is a flowchart illustrating a substrate processing method according to an embodiment of the inventive concept.

FIG. 6 is a flowchart illustrating a substrate processing method according to an embodiment of the inventive concept.

Referring to FIG. 6, the controller 630 measures an impedance change by using current flowing through the diaphragm 610 (Step S610). According to an embodiment, the controller 630 may measure a capacitance change of the diaphragm 610 by measuring the current flowing through the diaphragm 610.

Next, based on the impedance change, the controller 630 detects the degree of adsorption of particles on the inner wall of the chamber 100 or a surface of a part (Step S620). Specifically, when the capacitance change of the diaphragm

610 exceeds a preset range, the controller 630 may determine that the degree of adsorption of particles is beyond an allowable range.

In addition, step S620 may include a step of measuring the frequency of vibration of the plate 640, a step of predicting a degree of adsorption of particles based on a change in the frequency of vibration of the plate 640, and a step of verifying the accuracy by comparing the predicted degree of adsorption of particles with the degree of adsorption of particles detected based on the impedance change. Accordingly, the degree of adsorption of particles on the inner wall of the chamber 100 or the surface of the part may be more accurately detected.

As described above, according to the various embodiments of the inventive concept, the degree of adsorption of particles on the inner wall of the chamber 100 or a surface of a part may be accurately and conveniently measured by using an impedance change.

Hereinabove, although the inventive concept has been described with reference to exemplary embodiments and the accompanying drawings, the inventive concept is not limited thereto, but may be variously modified and altered by those skilled in the art to which the inventive concept pertains without departing from the spirit and scope of the inventive concept claimed in the following claims. Therefore, the exemplary embodiments of the inventive concept are provided to explain the spirit and scope of the inventive concept, but not to limit them, so that the spirit and scope of the inventive concept is not limited by the embodiments. The scope of the inventive concept should be construed on the basis of the accompanying claims, and all the technical ideas within the scope equivalent to the claims should be included in the scope of the inventive concept.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
    a chamber having a processing space inside;
    a support unit configured to support the substrate in the processing space;
    a gas supply unit configured to supply gas into the processing space;
    a plasma source configured to generate plasma from the gas supplied into the processing space; and
    a detection unit provided in a hole formed in a sidewall of the chamber, the detection unit being configured to measure an impedance change varying with a degree of deposition of particles introduced through the hole in the sidewall and detect a degree of adsorption of particles on an inner wall of the chamber or a surface of a part that is exposed to the processing space,
    wherein the detection unit includes:
        a diaphragm installed in an inspection space in the sidewall of the chamber and deformed by deposition of particles, the inspection space being in communication with the processing space.

2. The apparatus of claim 1, wherein the detection unit further includes:
    a voltage source configured to apply current to the diaphragm; and
    a controller configured to measure the impedance change by using the current flowing through the diaphragm and detect the degree of adsorption of particles based on the impedance change.

3. The apparatus of claim 2, wherein the detection unit further includes a plate spaced apart from the diaphragm and disposed farther away from the sidewall of the chamber than the diaphragm, and
    wherein one end of the voltage source is connected to the diaphragm and an opposite end of the voltage source is connected to the plate.

4. The apparatus of claim 3, wherein capacitance of the diaphragm is changed by deposition of the particles, and
    wherein the controller measures the capacitance change of the diaphragm and determines that the degree of adsorption of particles is beyond an allowable range, when the capacitance change of the diaphragm exceeds a preset range.

5. The apparatus of claim 3, wherein the detection unit further includes a measuring instrument configured to measure a frequency of vibration of the plate, and
    wherein the controller predicts a degree of adsorption of particles based on a change in the frequency of vibration of the plate and verifies accuracy by comparing the predicted degree of adsorption of particles with the degree of adsorption of particles detected based on the impedance change.

6. The apparatus of claim 2, wherein the diaphragm is implemented with a thin plate of 100 μm or less.

7. The apparatus of claim 4, wherein the controller outputs notification to inform of a replacement cycle of the chamber when it is determined that the degree of adsorption of particles is beyond the allowable range.

8. The apparatus of claim 1, further comprising a liner provided inside the inner wall of the chamber configured to protect the sidewall of the chamber,
    wherein the detection unit is provided in the hole formed in the sidewall of the chamber and the liner.

* * * * *